United States Patent

Simon

[15] 3,697,827

[45] Oct. 10, 1972

[54] STRUCTURE AND FORMATION OF SEMICONDUCTORS WITH TRANSVERSE CONDUCTIVITY GRADIENTS

[72] Inventor: Edward Simon, Manchester, Mass.

[73] Assignee: Unitrode Corporation, Watertown, Mass.

[22] Filed: Feb. 9, 1971

[21] Appl. No.: 113,932

Related U.S. Application Data

[63] Continuation-in-part of Ser. No. 626,900, March 29, 1967, abandoned.

[52] U.S. Cl. ....................................317/235, 317/234

[51] Int. Cl. ................................................H01l 5/00

[58] Field of Search ...............................317/235, 234

[56] References Cited

UNITED STATES PATENTS

| | | | |
|---|---|---|---|
| 2,869,055 | 1/1959 | Noyce | 317/235 |
| 3,001,895 | 9/1961 | Schwartz et al. | 148/1.5 |
| 3,012,305 | 12/1961 | Ginsbach | 29/25.3 |
| 3,575,741 | 4/1971 | Murphy | 317/235 X |

*Primary Examiner*—James D. Kallam
*Attorney*—Weingarten, Maxham & Schurgin

[57] ABSTRACT

An electrical semiconductor device in which the impurity concentration of a conduction region of independently controlled depth is graded in a direction parallel to an associated junction to provide varying areas of conduction across the junction with varying total junction current. The effect on junction performance by the transverse impurity gradients in the conduction region counteracts detrimental effects of current crowding and provides other improved device operating characteristics.

11 Claims, 26 Drawing Figures

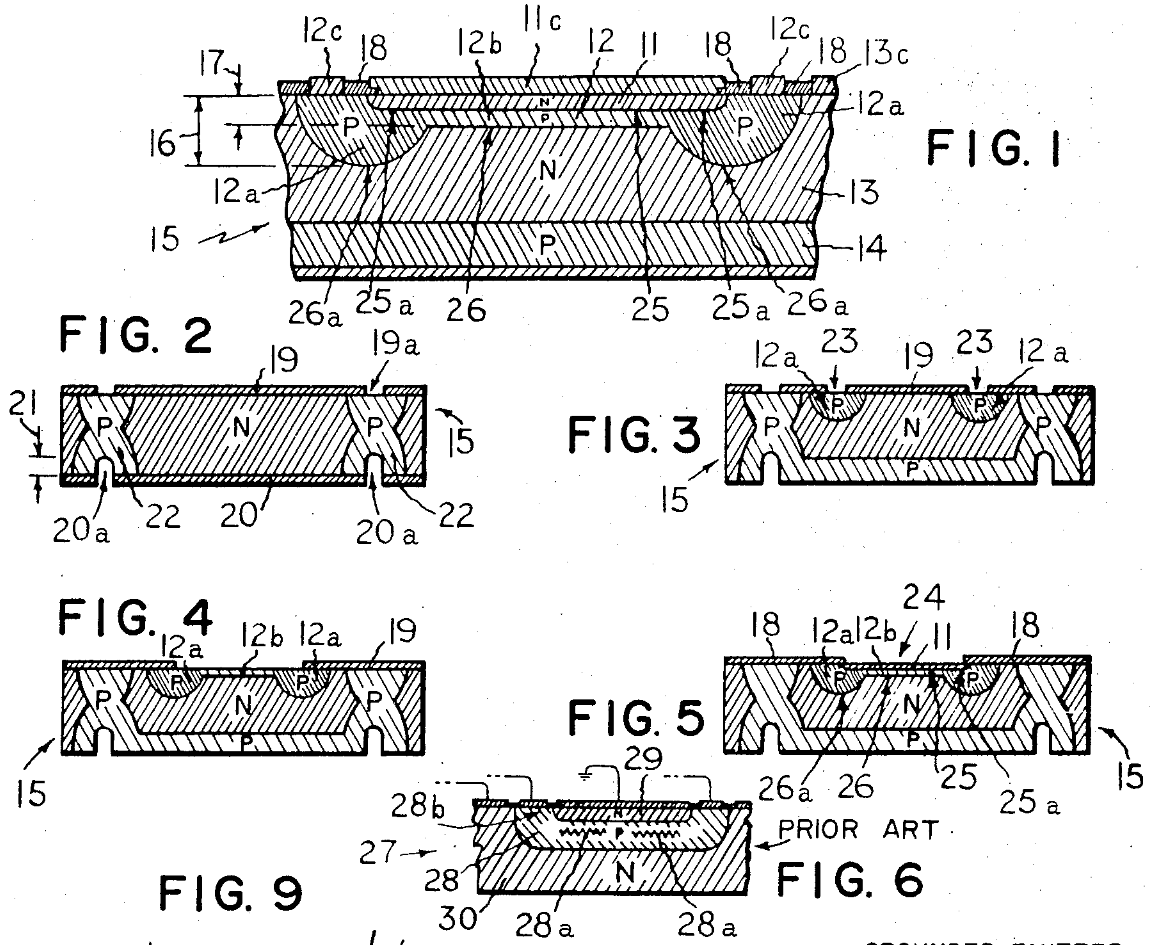
FIG. 1, FIG. 2, FIG. 3, FIG. 4, FIG. 5, FIG. 6, FIG. 9
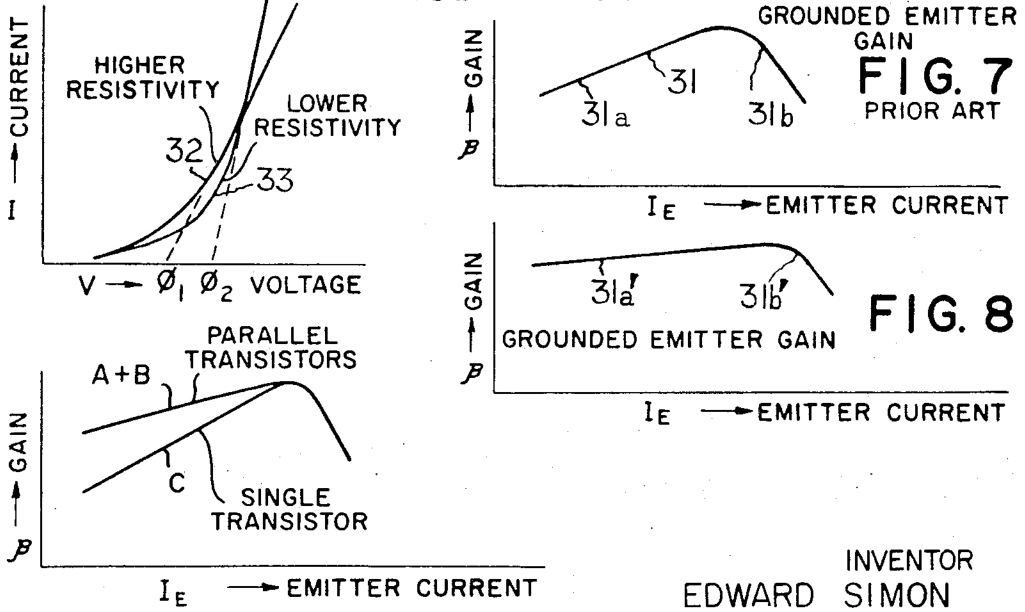
FIG. 7, FIG. 8
FIG. 10
INVENTOR
EDWARD SIMON
BY
Weingarten, Maxham & Schurgin
ATTORNEYS INVENTOR
EDWARD SIMON
BY
Weingarten, Maxham & Schurgin
ATTORNEYS INVENTOR
EDWARD SIMON
BY
Weingarten, Maxham & Schurgin
ATTORNEYS

STRUCTURE AND FORMATION OF SEMICONDUCTORS WITH TRANSVERSE CONDUCTIVITY GRADIENTS

CROSS-REFERENCE TO RELATED APPLICATIONS

This application is a continuation-in-part of copending application, Ser. No. 626,900 filed Mar. 29, 1967.

FIELD OF THE INVENTION

This invention relates to semiconductor devices, and in particular to planar semiconductor devices having lateral or transverse impurity gradients parallel to a junction.

BACKGROUND OF THE INVENTION

In the design and manufacture of semiconductor devices, especially transistors, the phenomenon of current crowding, in which the current across a planar semiconductor junction tends to concentrate toward the outer junction periphery, produces degradation of device performance over ideal junction characteristics. Previous known attempts to compensate for current crowding have usually employed junctions of convoluted or sinuous peripheral geometry in order to provide a greater area over which to spread the current flow. While these prior art devices reduce to some extent the effect of current crowding, the complex geometries involved lead to other deleterious effects which can impair device performance, such as by lessening high frequency response and switching speed and by providing nonlinear gain.

SUMMARY OF THE INVENTION

In accordance with the present invention, structure and methods of formation of a planar semiconductor device are provided in which the effects of current crowding are substantially eliminated by means of a transversely graded impurity concentration or conductivity in a semiconductor region of controlled depth. The region of graded conductivity extends, for example, from a central portion of low conductivity level to a peripheral portion of high conductivity level and forms a junction with a further semiconductor region throughout substantial parts of both the central and peripheral portions. The transverse gradient is provided by variation of the doping level in different portions of the semiconductor region. Control of the doping level is achieved by diffusion or ion-implementation techniques to provide a continuous or step-like doping level variation throughout the graded semiconductor region. In addition to control of the transverse conductivity gradient of the semiconductor region, control is independently provided by the depth of the semiconductor region to further improve device performance.

By virtue of the novel transverse grading of the semiconductor region, conduction across the associated junction occurs over progressively greater areas with variations in the total junction current. With a junction graded from a central portion of lower conductivity to a peripheral portion of higher conductivity, the area of conduction will spread from the central portion of the junction toward the peripheral portion with increasing current across the junction, with a result that the effect of current crowding can be reduced by inducing the current to occur first and preferably in the central portion of the junction. In addition to counteracting the current crowding effect, the invention also provides improved frequency response and switching speed, improved gain characteristics and reduction in device susceptibility to second breakdown and channelling. By use of the invention in the base region of a transistor, low current sensitivity and gain can be markedly improved over conventional transistors in which current gain can vary widely with device operating current.

DESCRIPTION OF THE DRAWINGS

To more fully understand the invention, reference is made to the following detailed description of preferred embodiments presented for purposes of illustration and not by way of limitation and by reference to the accompanying drawings in which:

FIG. 1 is a cross-section of a multi-junction semiconductor device constructed according to the present invention;

FIG. 2 illustrates, in cross-section, semiconductor material which is in an initial stage of processing toward the device form shown in FIG. 1;

FIG. 3 represents the material of FIG. 2 after a ring-type diffusion of an impurity;

FIG. 4 shows the same material following a shallow diffusion of a lesser concentration of impurity into the space within the ring formation in FIG. 3;

FIG. 5 illustrates the subsequent creation of a region of different conductivity type overlying both the shallow and part of the ring-diffused portions appearing in FIG. 4;

FIG. 6 depicts in cross-section a prior art form of semiconductor unit;

FIG. 7 graphically characterizes a gain vs. emitter current curve for a prior semiconductor unit such as that of FIG. 6;

FIG. 8 graphically illustrates an improvement in a gain vs. emitter current curve characteristic of the invention;

FIG. 9 graphically characterizes the forward direction current vs. voltage curve of a PN junction;

FIG. 10 graphically characterizes the gain vs. emitter current curves for a pair of parallel transistors having different base doping concentrations and a further transistor having an emitter area functioning as the combined emitter areas of the pair;

DESCRIPTION OF THE PREFERRED EMBODIMENTS

Figure 1A:
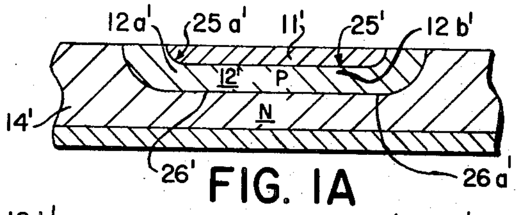
FIG. 1A is a cross-section of a device modified from that shown in FIG. 1.
Figure 3A:
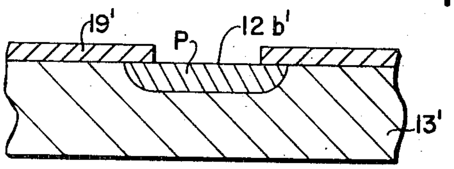
FIG. 3A represents the material of FIG. 2 after a central diffusion in the process of producing the device of FIG. 1A.

In FIG. 1, a planar semiconductor device is shown composed of regions 11–14 of alternately different conductivity types formed in a monolithic mass of semiconductor material 15. For present purposes in describing the invention, the physical characteristics of region 12 and its relationship to the neighboring region 13 are of particular interest. As is seen in FIG. 1, the lateral boundary portion 12a of region 12 has a greater depth 16 than the depth 17 of the central integral portion 12*b* disposed within this boundary. It will be appreciated that the deeper boundary portion 12*a* of region 12 fully surrounds the shallow portion 12*b*. The denser cross-hatching of boundary portion 12*a* also characterizes the fact that the material there is of significantly lower resistivity than is the material of the same conductivity type in the less densely cross-hatched central portion 12*b*. There are thus intentionally produced differences in conductivities in the one region, and these differences are in a transverse or lateral direction (i.e., normal to the depth direction of the semiconductor mass). Importantly, the neighboring region 11 of different conductivity type, nested within region 12, is proportioned to extend not only over its central portion 12*b* but also at least partly, and preferably substantially, over the boundary portion 12*a*, as shown. Electrical contacts 11*c*, 12*c* and 13*c* for the respective regions are provided along exposed surfaces, and protective coating material 18, such as silicon dioxide layers in the case of silicon semiconductor material, appears along other surfaces which are susceptible to contaminations.

The steps in one process for forming the arrangement of FIG. 1 are conveniently discussed with reference to FIGS. 2 through 5. Initially, a minute mass or die of N-type silicon 15, having a flat polished top surface which will later aid in the diffusion of impurity material to accurately controlled depths, is oxidized along at least the top and bottom surfaces to develop protective $SiO_2$ layers 19 and 20, preferably about 10,000 angstroms thick. After photo-resist material has been applied to the top and bottom surfaces, and then suitably masked, exposed, and etched, the oxide layers are stripped away in identical ring-like paths, 19*a* and 20*a*, which are in substantial alignment with one another. The bottom path 20*a* is chemically etched to a ring-like groove of substantial depth 21, the top surface being waxed or otherwise protected to prevent deeper etching there at the same time. This is followed by deep diffusion of an impurity (such as boron) which produces P-type characteristics, through both etched ring openings 19*a* and 20*a*, until the diffusions merge and a full ring-like region 22 of a P-type material is realized (FIG. 2).

Subsequently, the bottom oxide layer 20 is stripped away, using conventional photographic-etching techniques, and the same kind of stripping is performed at the top to produce a ring-like opening 23 (FIG. 3) above the N-type material. This is followed by a relatively deep diffusion of a relatively highly concentrated impurity which imparts P-type characteristics to the underlying material P-type the inner ring-like portion 12*a* and causes it to exhibit a relatively low resistivity. The region directly above stripped oxide 20 is also diffused with P-type characteristics. Some or all of central portion of the top oxide layer 19 which is encompassed within the ring-like opening 23 is next stripped away, using common photographic-etching techniques, for example, to expose the underlying N-type material. A relatively shallow diffusion is then performed with a relatively low concentration of impurity material imparting P-type conductivity characteristics. As is shown in FIG. 4, this results in the desirable P-type portion 12*b* below the flat top surface and of relatively high resistivity, merging with the low-resistivity boundary portion 12*a* to form a substantially continuous variation in resistivity from portion 12*b* to 12*a*.

Following production of the shallow portion 12*b*, a protective oxide coating 18 is grown over the top surface and is then stripped away at a site 24 over both the shallow portion 12*b* and part of the low-resistivity boundary portion 12*a*, as shown in FIG. 5. A subsequent shallow diffusion of impurity material, such as phosphorous, producing N-type conductivity characteristics, will then yield the desired N-type layer 11 within all of shallow portion 12*b* and within substantial areas of the peripheral boundary portion 12*a*. N-type layer 11 forms a junction area 25 closely and precisely spaced in relation to the junction area 26 between P-type layer portion 12*b* and N-type zone 13 (FIGS. 1 and 5), this exact relationship being highly important in transistors and four-layer switching devices, for example. Marginal junction areas 25*a* and 26*a* are more widely spaced, but their relation in many cases is not as critical provided the relation of the junction areas 25 and 26 is well controlled. As will be subsequently explained, the wider spacing of junction areas 25*a* and 26*a* produce certain device current gain characteristics which in some instances is advantageous.

It is, nevertheless, beneficial in other situations to control junction width or spacing in a semiconductor device throughout the lateral extent of the junctions and to avoid an increased width in the peripheral region. In an alternative arrangement, the boundary area 12*a* may be more heavily doped, to possess the desired lower resistivity, while yet not being deeper than the central high resistivity portion 12*b*. The desired lateral differences in resistivity, in alternative practices, can be achieved by way of so-called ion-implantation described below, or applied high voltage techniques, or by other techniques producing like results. Deep concentrated diffusions in the ring or boundary portion 12*a* will involve creation of relatively high resistivities in this portion, but these resistivities will inherently tend to be non-uniform, being lowest near the center and higher near the outer limits of the rings and thus reflecting the gradients in impurities which appear upon diffusion. Such continuous gradients can be of major benefit, in contradistinction to abrupt changes between two discrete levels of resistivity, since the lateral resistivity gradients impart certain desirable infinitely or continuously variable electrical characteristics to the device. Junctions 25 and 25a thus tend to merge in a continuum of variation of junction characteristics. To the extent that the junction areas 25 and 25a represent high and lower resistivities, however, the relative areas of the junctions 25 and 25a may be varied and the peripheral junction area 25a made substantially larger than the central junction area 25, or vice versa as desired.

Important differences in relation to a conventional arrangement of transistor semiconductor regions may be readily perceived with reference to the prior art type of planar unit 27 appearing in FIG. 6. There, the base region 28 is electrically associated with a grounded emitter 29 and collector 30 by way of external contacts and leads, and the usual resistances 28a of the material of the base region, extending in the lateral or transverse direction, cause related voltage drops due to current flow in these lateral directions. As a consequence of these voltage drops, the device operates to provide a lower voltage junction drive or bias nearer the center of the emitter-base junction area, and a higher voltage junction drive or bias nearer the lateral peripheral areas of the emitter-base junction. It is because of such behavior that current is concentrated or crowded near the emitter periphery, near the base contact, and these dense currents tend undesirably to localize related effects to such an extent that the device tends to act as though its only emitter area was the narrow portion near its emitter periphery.

By utilization of a novel transversely graded junction region, according to the invention current crowding tendencies are automatically compensated. This is understood to result from the fact that, under relatively low voltage across junction 25, 25a, the higher resistivity material (lightly doped) in the central portion of bordering region 12b (FIGS. 1 and 5), inherently provides for device conduction at low current more readily than more heavily doped portions 12a. But, as the junction voltage and current increase, the lower resistivity material (heavily doped) in the peripheral portion 12a automatically begins to participate in conduction across the junction. Accordingly, the device exhibits desirable high sensitivity at low operating current levels, and yet good conduction occurs through both the central and peripheral portions of the base semiconductor region when necessary. The central portion of this region does not become cut-off and the current density is more constant as the junction current spreads peripherally with increasing current rather than being concentrated along narrow edges. The conduction area effectively increases automatically as this benefit is required in operation. Where the peripheral portions have gradients in resistivity, rather than exhibiting more abrupt change, as in the case of the aforementioned deeply diffused ring portions inherently involving resistivity gradients, the effective increase in area is desirably gradual or "infinitely-variable" in character. The novel transversely graded region can also be employed in conjunction with a sinuous junction geometry to further enhance current spreading and correspondingly improve device performance.

The different peripheral conductivity which results from heavier doping also results in important advantages in relation to so-called "channelling" effects. Having reference to FIG. 6 once again, it is noted that portion 28b of region 28 which lies near the surface of the prior art device can effectively function as a "short" between emitter 29 and collector 30, as the result of ion or electron movements through semiconductor latice "channels" or contaminations effectively changing its type of conductivity (i.e., in the case under discussion, the P-type material at site 28b may exhibit N-type characteristics and hence operate to short the adjoining N-type regions). High temperature reverse bias leakage stability is directly affected by such "channelling", for example the effects are in fact present, whether they be caused by actual unwanted doping or contamination actions or are instead merely induced by electrical or other phenomena. Normally, the affected material of portion 28b would be only lightly doped or otherwise processed to exhibit the high resistivity needed for a high sensitivity device (i.e., only small currents needed for switching or control). The present invention, on the other hand, will, in a preferred practice, yield relatively low resistivity at the critical near-surface site 12a of the FIG. 1 device as the result of relatively heavy doping there, while at the same time affording high-sensitivity characteristics because of the high-resistivity (light doped) material in central portion 12b. With the low resistivity material, heavily doped at the sites of susceptibility to channelling, the deleterious but small "channelling" tendencies cannot swamp and alter the effective conductivity type of that material, and important improvement is thus realized.

One commonly encountered difficulty in amplifier operation of planar transistors is associated with non linear gain, typified by curve 31 of FIG. 7, which depicts grounded emitter current gain $\beta$ vs. emitter current $I_E$. At low current levels, the gain is relatively low, as at 31a and it is obviously desirable both to increase such gain and also to extend the useful gain at higher current levels. As is known, the gain is approximately doubled for every 10-fold increase in $I_E$ at low current levels; however, with the improvements disclosed herein, the effective emitter current density is made substantially independent of $I_E$, especially at low current levels, and the gain at low levels is increased as shown at 31'a, in FIG. 8. Moreover, because the effective area of the emitter (such as region 11 in FIG. 1) is made substantially proportional to $I_E$, the curve tends to be flattened and extended as at 31'b in FIG. 8.

Certain of the phenomena which are present in the improved semiconductor arrangement may be conveniently viewed in relation to barrier height theory and in relation to parallel-operated devices. Barrier height $\phi$ is related to doping levels on both sides of a PN junction, and must be overcome before the PN junction can conduct heavily in the forward direction. FIG. 9 shows the forward direction current vs. voltage characteristics 32 and 33 for PN junctions having, respectively, higher and lower resistivities (i.e., lower and higher doping concentrations) such as 10 and 1 ohm centimeters in the N regions. The barrier heights (extensions of the high conducting sections of the curves to the abscissa) are seen to be lower, $\phi_1$, for the case of higher resistivity material, and higher, $\phi_2$, for a lower resistivity material. Were two such junctions operated in parallel, only the one with the lower barrier height $\phi_1$ would conduct at an applied voltage above the voltage of $\phi_1$ but below $\phi_2$, with the other remaining essentially cut off; increase in the voltage to at least the level of $\phi_2$ would result in conduction of both junctions in parallel.

These considerations may be applied in explanation of certain effects which may be produced with transistor structures. Specifically, referring to FIG. 10, the emitter current gain vs. emitter current characteristic (curve A+B) of two paralleled planar diffused transistors, differing only in internal base doping concentrations, is compared with that of a third like transistor (curve C) having the same lower base concentration as one of the two paralleled transistors but also having an emitter area equal to the sum of the emitter areas of the two paralleled transistors. For any given low emitter current drive, where the base-emitter voltage exceeds only the barrier level voltage for the transistors C and B, these transistors will conduct while the transistor A remains cut off. However, inasmuch as transistor B is then operating with twice the current density as that of transistor C, its gain will be higher than that of transistor C. With increased emitter current drive, and a base-emitter voltage also exceeding the barrier level voltage for transistor A, this transistor will also contribute its area, and thus the gain curve A+B is flatter and at a higher level at least for lower currents, as shown in FIG. 10. This improvement corresponds to that for curve portion 31'a in FIG. 8, where an improved transistor with lower peripheral base resistivity and an overlapping emitter would function as though involving a plurality, if not an infinite number, of paralleled regions with the base carrier concentrations being variable according to the gradients in the peripheral portions. Although it is not attractive in practice to connect numerous separate devices in parallel to obtain like effects, the single device of the present invention, making use of transverse gradients, is highly advantageous in practice to achieve variable area conduction.

From the characteristics of semiconductor devices according to the invention as described above, it is clear that the doping levels throughout the region of transverse doping level gradients must be such as to provide semiconductor operation of all portions of that region during normally encountered device current levels, but with portions of differing doping level being first operative at different current levels within that range. It is accordingly clear to those trained in the art that certain typical doping levels will be required in semiconductor devices to achieve these characteristics. By way of example, for the base of a transistor semiconductor device having a 100 to 1 variation between portions of relatively higher and relatively lower doping concentrations, typical doping levels will be $10^{19}$ atoms per cubic centimeter in the portions of relatively higher doping level and $10^{17}$ atoms per cubic centimeter in the portions of relatively lower doping level within the base region. Lower doping level ratios will produce correspondingly different absolute doping levels. It must be understood that these figures are only typical and illustrative, allowing for a slight increase in doping levels and a substantial decrease in the doping levels in absolute value while maintaining device operation in accordance with the invention. The doping concentrations given refer to portions of the region to which they apply directly adjacent to the semiconductor junction affected by the concentrations. Furthermore, for specialized semiconductor devices such as high current diodes, four and five layer devices, etc., substantially different doping levels may be required to provide proper doping for different portions of a semiconductor region and bordering junction which are differently operative at varying device current levels.

With wider peripheral junction spacing as is shown for portion 12*a*, in the embodiment of FIGS. 1 and 5, the peaking 31'*b* of the device gain shown in FIG. 8 is at a higher current than with closer junction spacing and thus provides a greater useful current range to the device while achieving the improvements in current spreading. To an extent the useful current range can be kept high through greater doping concentrations in the region 12*a* rather than greater junction spacing through the peripheral region 12*b*. This is important because it is advantageous in some cases to control the junction spacing and in particular maintain uniformity in spacing throughout the region 12. Where high frequency switching is important, switching speed and high frequency behavior is improved by reducing the spacing of the junctions in the peripheral area so that spacing is uniform throughout region 12. Thus, because uniform spacing and other spacing relationships are useful, it is important to be able to control the junction spacing throughout a semiconductor region of lateral or transverse doping level gradients.

A semiconductor device is shown in FIG. 1A wherein the junction spacing is substantially uniform throughout a region of lateral or transverse impurity gradients. In particular, within a body 13' of N-type semiconductor material, P-type region 12' is diffused having central portion 12*b'* and peripheral portion 12*a'*. Nesting within the region 12' is a region 11' of N-type semiconductor material. The central portion 12*b'* has relatively low net P-type doping concentrations, but the P-type doping level 12' increases in a lateral direction to the portion 12*a'* which has relatively high net P-type doping levels. A junction 25' is formed between the regions 11' and 12' and a junction 26' is formed between the regions 12' and 13'. The spacing between the junctions 25' and 26' is maintained substantially uniform throughout the lateral extent of the junctions 25' and 26' such that peripheral junctions 25*a'* and 26*b'* are spaced at substantially the same distance apart.

Construction of the device of FIG. 1A is achieved through diffusion techniques slightly altered from the steps shown in FIGS. 2–5. In particular, the structure as formed in FIG. 2 is processed according to FIG. 3A by providing a circular etched hole through the oxide 19' through which a diffusion is made to produce a net P-type semiconductor region which will become portion 12*b'* of relatively low doping level within the N-type body 13'. In FIG. 4A, after the oxide 19' is reformed over the surface of the semiconductor device of FIG. 3A an etched annular opening 23' is produced through the oxide 19' with the annular opening 23' having an inner circumference coaxial with the portion 12*b'* and located approximately above its lateral periphery. A diffusion is made through the opening 23' to produce what will become the portion 12*a*' of substantially higher net P-type doping level.

Figure 4A:
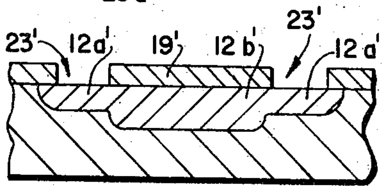
FIG. 4A shows further processing of the material of FIG. 2A toward arriving at the device of FIG. 1A.

Because the doping concentration produced during the diffusion through the opening 23' is considerably higher than the doping level in the inner portion 12*b*', the outer portion 12*a*' tends to diffuse more rapidly and catch up with the more slowly diffusing portion 12*b*' during diffusion of portion 12*a*'. As shown in FIG. 4A, however, the outer portion 12*a*' of higher doping level, has been diffused to a slightly shallower depth than the total diffusion of the inner portion 12*b*' at the termination of the diffusion through the opening 23'. The device of FIG. 4A is then processed as indicated above in conjunction with FIG. 5 to produce the device indicated in FIG. 1A. The diffusion of FIG. 5 to produce the region 11' as indicated in FIG. 1A creates some additional deepening of the portions 12*a*' and 12*b*' such that they reach a point of equal depth at the end of the diffusion through the region 11' of net N-type semiconductor impurity or a depth varying with variations in the depth of region 11'. The resulting device has uniform junction spacing throughout the region 12', and exhibits improved high frequency and switching characteristics.

Further improvements may now be understood by reference to FIGS. 11–23 which show various ways of forming semiconductor devices with regions of peripherally increasing conductivities and various techniques for controlling junction spacing through these regions of varying conductivity.

Figure 11:
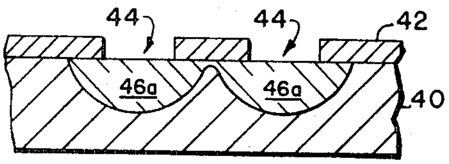
FIGS. 11–14 are sectional views of various stages of manufacture of a semiconductor device according to an aspect of the invention.
Figure 12:
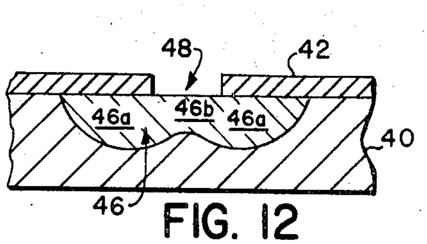

Referring to FIGS. 11–14 there are shown novel diffusion methods for manufacturing a transverse doping level gradient in the base of a transistor type semiconductor device, while maintaining uniformly in junction separation through the base region. In FIG. 11, a substrate 40, doped to provide one conductivity type, has an insulating strip 42 covering a surface except for an annular, etched opening 44 therethrough. A diffusion into a portion 46a is made through annular opening 44 to produce a relatively high doping level concentration which may or may not be centrally joined. In FIG. 12 the oxide for insulation 42 is regrown and a hole 48 is etched therethrough, being smaller than and substantially coaxial with the outer border of previous opening 44. Diffusion through the hole 48 of the same or similar type dopant to that used through the opening 44 increases the depth of the diffusion 46*a* at the center creating the portion 46*b* within portion 46*a*. The diffusion through the hole 48 is carried on with doping concentrations substantially lower than the concentrations for the portion 46*a* so that the portion 46*b* has a significantly lower doping level than but similar doping type to the portion 46*a*. Representative doping levels, presented for illustration and not for limitation, are $10^{19}$ atoms per cubic centimeter in the portion 46*a* and $10^{17}$ atoms per cubic centimeter in the portion 46*b*. Portions 46*a* and 46*b*, in merging during diffusion, form a semiconductor region 46 of the same conductivity type but with a transverse variation therein proceeding from central to peripheral portions 46*b* and 46*a* respectively.

Figure 13:
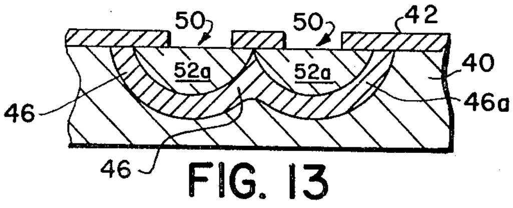
Figure 14:
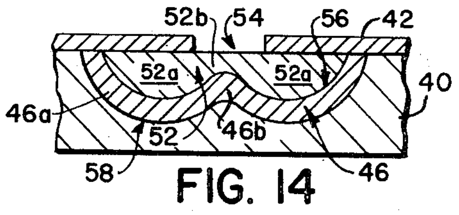

In FIG. 13 a region of opposite conductivity type to portions 46*a* and 46*b* is diffused through an annular opening 50 in regrown insulation 42. The annular opening 50 is substantially coaxial with the closed annular opening 44 but smaller. A diffusion of appropriate substances through the annular opening 50 produces a doped portion 52*a* having doping and conductivity characteristics opposite to those of the region 46. In FIG. 14, after regrowth of the oxide insulation 42, a hole 54, coaxial with the annular opening 50, is produced through the insulation 42 for further diffusion to deepen and provide a central portion 52*b* within and of the same conductivity type as the diffusion 52*a*. The doped portions 52*a* and 52*b* form a region 52 of a uniform conductivity type. A transverse doping level gradient may be created or not as desired by controlling the diffusion through the annular opening 50 and hole 54.

The resulting device of FIG. 14 provides two W-shaped nested, semiconductor junctions 56 and 58 between respective semiconductor regions of opposite doping and conductivity characteristics, and forming respectively in the case of a transistor semiconductor device the emitter-base and base-collector junctions.

The device of FIG. 14 provides substantial control over the spacing between the junctions 56 and 58 through the semiconductor region 46 making it possible to obtain a uniform or varying spacing as desired.

By ion-implantation techniques a greater degree of control over junction spacing can be achieved with semiconductor devices having a transverse impurity gradient between the junctions. Other benefits acrue as well from ion-implantation, such as sharper conduction region boundaries, and lower total accumulations of impurity concentration as occur with successive alternate type diffusions.

Figure 15:
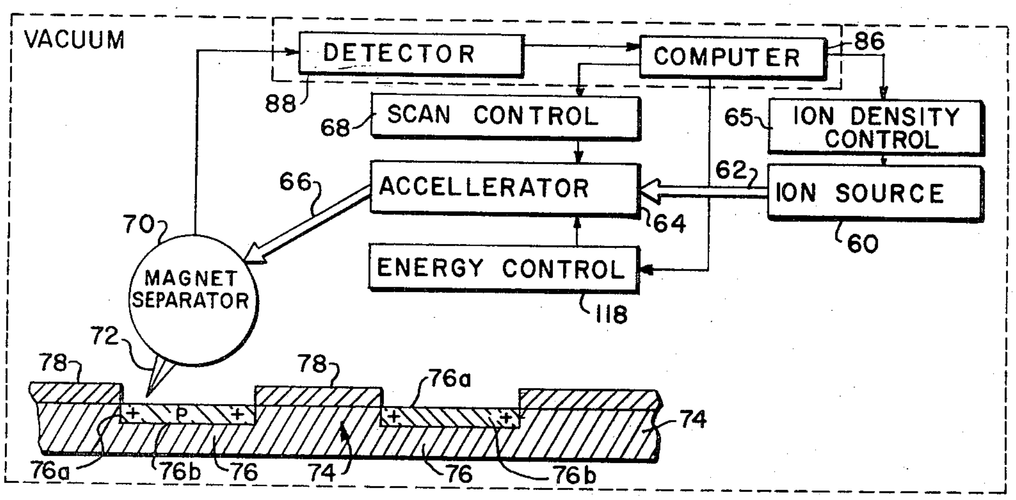
FIG. 15 is a sectional view of a semiconductor device together with a block diagram of an ion-impurity implantation system.

By reference to FIG. 15 there is shown ion-implantation apparatus for achieving control over junction spacing through a region of transverse doping level gradient. An ion source 60 provides a beam of ions 62 to an accelerator 64 with the ion density in the beam 62 controlled by an ion density control 65 operative on the ion source 60. The accelerator 64, in addition to accelerating the ions to specified energy levels, provides an output ion beam 66 scanned through ranges of orthogonal angles under controls from a scan control 68. The ion beam 66 enters a magnet separator 70 which provides focusing and energy separation of the beam 66 and impinges a focused ion beam 72 with or without a substantially uniform energy upon a semiconductor substrate 74 of one conductivity type. Ions from the beam 72 are implanted into a region 76 between oxide coverings 78 to impart to the region 76 doping and conductivity type characteristics opposite to the conductivity of substrate 74 as determined by the nature of the ions in the beam 72. As viewed from above, the region 76 may have a rectangular or circular shape.

Figure 16:
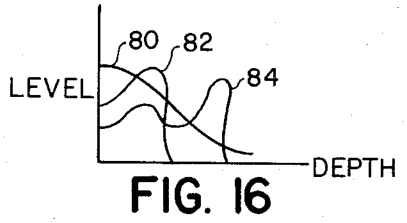
FIG. 16 is a graph of doping levels vs. penetration useful in explaining the invention.

As indicated in FIG. 16, the doping level versus substrate penetration curve for diffusion, 80, indicates a substantially less abrupt doping level change than the curves for uniform energy ion-implantation, 82 and 84. Curve 82 shows ion implantation without channeling while curve 84 shows it with channeling. Substantially sharp borders are thereby achievable for the boundaries of a region of a particular doping and conductivity type while the position of the boundaries is easily controlled by beam energy.

In order to achieve a transverse doping level gradient in the region 76 the scan control 68 and ion density control 65 are manipulated so as to provide side by side or overlapping scans by the ion beams 72 across the surface of region 76. The density of the ions in the beam 72 on the scan rate of the beam is varied in a predetermined manner to cause greater peripheral concentration of dopant in portion 76a than central concentrations in portion 76b.

The variation of ion beam density or scan rate is controlled by a computer 86 with or without a detector 88 determining the position of the ion beam 72 relative to the substrate 74 and region 76 and providing feed back control and monitoring of the scan position.

Figure 17:
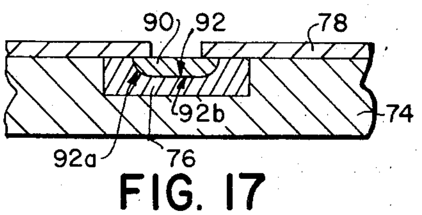
FIG. 17 is a cross-sectional view of a semiconductor device in the form of a transistor manufactured in accordance with combined ion-implantation and diffusion techniques.
Figure 18:
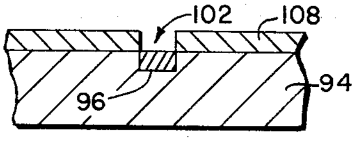
FIGS. 18–21 are cross-sectional views of various stages in the manufacture of a semiconductor device according to a further aspect of the invention.
Figure 19:
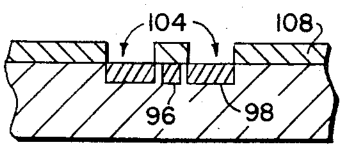
Figure 20:
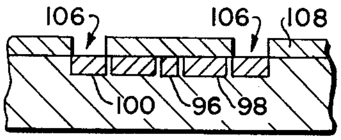
Figure 21:
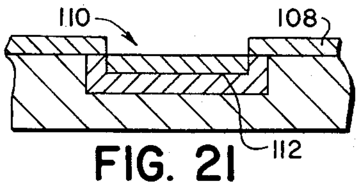

Referring to FIG. 17 there is shown a completed transistor semiconductor device according to the ion-implantation technique of FIG. 15 after having an emitter region 90 diffused into region 76. A central part 92b of a junction 92 between the regions 76 and 90 is provided with a relatively low concentration of dopant in the adjacent portion 76b while peripherally along the junction in a transverse direction the doping level in the region 76 increases substantially continuously to relatively higher levels bordering a peripheral part 92a of the junction 92. Through the use of ion-implantation techniques the base width between the region 90 and the substrate 74 can be accurately controlled and as in this case, made substantially uniform.

By way of modification of the semiconductor device practicing aspects of the invention achieved through ion-implantation an example is given in FIGS. 18–21 showing a transistor with a base formed by ion-implantation techniques and given a transverse doping level gradient. By implanting ions into a substrate 94 through sequentially opened hole 102 and annular openings 104 and 106 a series of concentric base regions 96, 98 and 100 are formed. The resulting structure of FIG. 20 has base portions 96, 98, 100 formed with equal depths by equal energy in the ion-implantation beam but with varying doping level concentrations by variation of either the scan rate or ion beam density during implantation in each region. An emitter region 112 is shown added in FIG. 21 by ion-implantation or diffusion through a hole 110 in the insulation 108. If the emitter region 112 is diffused, the base regions, 96, 98 and 100 tend to diffuse. Consequently these base regions need only be closely spaced during ion-implantation, but regions of higher concentration should be more shallow to provide uniform junction spacing with a continuous doping level gradient provided by the different doping levels in the base regions 96,98 and 100. More abrupt doping level changes are achieved between the base regions 96, 98 and 100 if the emitter region 112 is itself produced by ion-implantation and the base region implanted in direct contact adjacent to each other.

Figure 22:
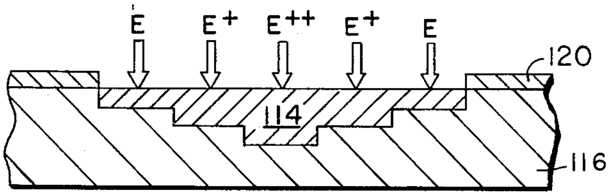
FIGS. 22–23 are cross-sectional views of a semiconductor device according to a further aspect of the invention.
Figure 23:
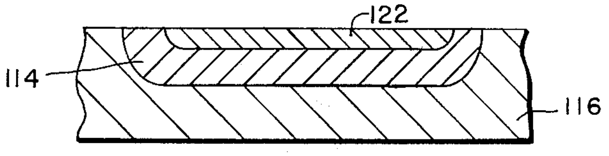

FIGS. 22 and 23 show further alternations and modifications of the semiconductor structure. In FIG. 22 a semiconductor region 114 is formed by ion implantation in a substrate region 116 of opposite conductivity type. A stair-case effect to the depth of the region 114 is achieved by varying the energy of the ion-implantation beam at various points in the scan across the substrate 116 by an energy control 118 applied to the accelerator 64 and operated by the computer 86 in FIG. 15. The staircasing effect can be achieved by varying the energy in the beam during a single scan or by using a multiple scan for a sequence of different openings through an oxide insulation 120 across the surface of the substrate 116 as used in FIGS. 18–21. Each portion of different depth in the region 114 of FIG. 22 is provided with the same conductivity type at different doping concentrations that provide highest doping levels in the portions of region 114 having the shallowest depth.

In FIG. 23 a region 122 of opposite conductivity type is diffused into the region 114 to form a transistor semiconductor structure with the diffusion heat required for producing region 122 operating to even out the depth of the different portions of region 114 to provide a uniform spacing through the base region 114 between the emitter region 122 and the substrate or collector region 116. The more heavily doped, but shallower portions of the region 114 tend to diffuse more rapidly and thereby catch up with the more lightly doped but more deeply diffused portions.

While uniform base depth or width may in most cases be desirable it is possible to vary the base width according to preselected characteristics for the semiconductor device. The techniques indicated above provide independent control over junction spacing and transverse doping level gradients so that the advantages achieved with transverse doping level gradients need not be limited to a particular junction configuration. The general techniques and structures described for creating regions of transverse doping level gradient bordering semiconductor junctions are also suitable for the construction of diode, thyristor, five layer, and other semiconductor junction devices.

In devices practicing the concept of a transversely varying doping level having relatively higher peripheral and low central concentrations several additional benefits result. Reduction of highly localized power concentrations, due to counter-acting of current crowding for example, eliminates hot spots and leads to devices with improved temperature coefficients. Maximum operating power is increased, and second breakdown characteristics are improved, as the result of these beneficial changes in thermal and power-handling attributes. Improvements in frequency response vs. $I_E$, and in switching speed vs. $I_E$, result from reduction in effective base widening and from reduction in device area, and improvements in the $V_C$ v. $I_C$ curve in saturation result from an increase in effective region area. These and other benefits provide the basis for improvement of existing types of devices and for the creation of yet other devices wherein metallurgy design provides a useful control over different conduction characteristics within a semiconductor region. It is not necessary that the emitter be in a single continuous form, provided the different portions are arrayed to produce cooperative effects like those realized with one emitter region. The transverse impurity gradients may also be caused to exist in more than one region, as in both emitter and base regions, for example.

Accordingly, it is to be understood that the embodiments and practices described and portrayed have been presented by way of disclosure, rather than limitation, and that various modifications, substitutions and combinations may be provided without departure from the spirit and scope of this invention.

What is claimed is:

1. A semiconductor unit comprising:
a mass of semiconductor material of one conductivity type;
a first region of semiconductor material of opposite conductivity type formed in said mass and providing a first junction therewith; and
a second region of said one conductivity type formed within said first region in nesting relationship and providing a second junction therewith;
said first and second junctions having substantially uniform spacing therebetween throughout said first region;
said first region having a transverse conductivity gradient in a direction substantially parallel to said first and second junctions, said gradient extending between a central portion of relatively lower conductivity and a peripheral portion of relatively higher conductivity.

2. The semiconductor unit of claim 1 wherein the conductivity of said first region is imparted by ion-implanted atoms of a first type and further wherein said second region contains ion-implanted atoms of said first type to a concentration below the concentration in said first region.

3. The semiconductor unit of claim 1 wherein:
said first and second junctions intersect a surface of said mass at peripheral portions of said first and second junctions;
said second region comprises central and peripheral separately produced portions whereby said first and second junctions may be substantially matched; and
said first and second junctions extend centrally from points of intersection of said surface in arcs directed away from said surface of said mass at the points of intersection with said surface and arcs directed back toward said surface of said mass nearer the central extent of said junctions.

4. The semiconductor unit of claim 1 wherein:
said first region comprises partially diffused, implanted ions imparting said opposite conductivity type; and
said second region comprises diffused ions imparting said one conductivity type.

5. A semiconductor unit comprising:
a mass of semiconductor material of one conductivity type;
a first region of semiconductor material of opposite conductivity type formed in said mass and providing a first junction therewith; and
a second region of said one conductivity type formed within said first region in nesting relationship and providing a second junction therewith;
said first region having a transverse conductivity gradient in a direction substantially parallel to said first and second junctions, said gradient extending between a central portion of relatively lower conductivity and a peripheral portion of relatively higher conductivity;
said first and second junctions being spaced at least substantially as far apart through said portion of lower conductivity as through said portion of higher conductivity.

6. A semiconductor unit comprising:
a mass of semiconductor material of one conductivity type;
a first region of semiconductor material of opposite conductivity type formed in said mass to produce a first junction therewith;
said first region having a gradient in the conductivity thereof existing in a direction parallel to said first junction from a central portion of said first region of relatively lower conductivity to a peripheral portion of said first region of relatively higher conductivity;
a second region of said one conductivity type formed within said first region to provide a second junction therewith;
said second junction extending adjacent said first region throughout the gradient portion of said first region and substantially coextensive with portions of both relatively higher and lower conductivity of said first region.

7. The semiconductor unit of claim 6 wherein said first and second junctions are substantially uniformly spaced.

8. A semiconductor unit comprising:
a mass of semiconductor material of one conductivity type;
a first region of semiconductor material of an opposite conductivity type formed within said mass and providing a first junction with said mass of semiconductor material;
said first region having a plurality of portions of relatively different conductivities imparted by a plurality of different concentrations of dopant producing said opposite conductivity type;
a second region of said one conductivity type formed within said first region and providing a second junction with said first region;
said second junction extending in adjacent relationship to said plurality of portions of different conductivity type of said first region;
said second junction being operative in response to potentials applied to said first and second regions and said mass of semiconductor material to conduct current of relatively low levels across portions of said second junction adjacent to portions of said first region of relatively lower conductivity and to conduct currents of relatively higher levels across said second junction at points adjacent to portions of said first region of relatively higher conductivity as well as portions of relatively lower conductivity.

9. A semiconductor unit comprising:
a mass of semiconductor material of one conductivity type;
a first region of semiconductor material of opposite conductivity type formed in said mass to provide a first junction with said mass;
said first region having a first portion of predetermined significantly higher conductivity and having a concentration of dopant producing said predetermined higher conductivity of no greater than $10^{19}$ atoms per cubic centimeter;
said first region having a second portion of a predetermined significantly lower concentration than said first portion;
a second region of said one conductivity type formed within said first region to provide a second junction with said first region;

said second junction extending adjacent to said first region from said portion of no greater than $10^{19}$ atoms concentration to said portion of significantly lower concentration to produce areas of conduction across said second junction in response to potentials applied to said first and second regions and said mass which are substantially limited to the portion of said second junction adjacent to said portion of significantly lower impurity concentration for low current levels and which areas of junction conduction increase to encompass the portion of said second junction adjacent to the portion of higher impurity concentrations with increasing junction current.

10. The semiconductor unit of claim 9 wherein:

said portion of relatively lower impurity concentration of said first region is centrally located within said first region;

said portion of relatively higher impurity concentration of said first region is peripherally located around said portion of relatively lower impurity concentration; and said second junction extends from points adjacent said central portion of relatively lower impurity concentrations to points adjacent substantial parts of said peripheral portion of relatively higher impurity concentrations.

11. The semiconductor unit of claim 9 wherein:

said first and second junctions bounding said first region are substantially uniformly spaced throughout the active current carrying portion of said second junction.

* * * * *